(12) United States Patent
Kinoshita et al.

(10) Patent No.: US 9,487,697 B2
(45) Date of Patent: Nov. 8, 2016

(54) COMPOSITE WAVELENGTH CONVERSION POWDER, RESIN COMPOSITION CONTAINING COMPOSITE WAVELENGTH CONVERSION POWDER, AND LIGHT EMITTING DEVICE

(71) Applicant: Sumitomo Osaka Cement Co., Ltd., Tokyo (JP)

(72) Inventors: Toru Kinoshita, Tokyo (JP); Tsutomu Nozoe, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 0 days.

(21) Appl. No.: 14/423,589

(22) PCT Filed: Sep. 19, 2013

(86) PCT No.: PCT/JP2013/075281
§ 371 (c)(1),
(2) Date: Feb. 24, 2015

(87) PCT Pub. No.: WO2014/046173
PCT Pub. Date: Mar. 27, 2014

(65) Prior Publication Data
US 2015/0299566 A1  Oct. 22, 2015

(30) Foreign Application Priority Data

Sep. 21, 2012 (JP) ................................. 2012-208651
Jan. 30, 2013 (JP) ................................. 2013-015563

(51) Int. Cl.
| | | |
|---|---|---|
| *H05B 33/14* | (2006.01) | |
| *C09K 11/77* | (2006.01) | |
| *C09K 11/02* | (2006.01) | |
| *H05B 33/22* | (2006.01) | |
| *H01L 33/50* | (2010.01) | |

(52) U.S. Cl.
CPC .......... *C09K 11/7774* (2013.01); *C09K 11/025* (2013.01); *C09K 11/7792* (2013.01); *H05B 33/22* (2013.01); *H01L 33/501* (2013.01); *H01L 33/502* (2013.01); *H01L 2224/45147* (2013.01); *H01L 2224/48091* (2013.01); *H01L 2224/8592* (2013.01)

(58) Field of Classification Search
CPC .. C09K 11/7774; C09K 11/025; H05B 33/22
See application file for complete search history.

(56) References Cited

U.S. PATENT DOCUMENTS 7,963,817 B2 * 6/2011 Kameshima .......... C03C 14/004
313/512
2006/0038194 A1 * 2/2006 Terashima ............... G02B 1/02
257/98
2006/0152139 A1 * 7/2006 Hsieh .................. C09K 11/7774
313/503
2011/0063592 A1 * 3/2011 Ezura ................. C09K 11/7748
355/53
2011/0309398 A1 * 12/2011 Ito ......................... H01L 33/505
257/98

FOREIGN PATENT DOCUMENTS

| JP | 10247750 A | 9/1998 | |
|---|---|---|---|
| JP | 2003246981 A | 9/2003 | |
| JP | 2007126536 A | 5/2007 | |
| JP | 2007324475 A | 12/2007 | |
| JP | 2010520337 A | 6/2010 | |
| JP | 2010155958 A | 7/2010 | |
| JP | 2011503266 A | 1/2011 | |
| WO | WO 2009154193 A1 * | 12/2009 | ........... C04B 35/553 |

OTHER PUBLICATIONS

NuSil "Silicone Technology" , Phosphors and Silicone Dspersions, Report presented at the Phosphor Global Summit, Feb. 28-Mar. 2005, San Diego, CA, p. 10.*

Japanese Patent Office, International Search Report issued in corresponding International Patent Application No. PCT/JP20131075281 and English-language translation mailed Oct. 15, 2013.

* cited by examiner

*Primary Examiner* — Donald Raleigh

(74) *Attorney, Agent, or Firm* — Wood Herron & Evans LLP

(57) ABSTRACT

A composite wavelength conversion powder and a resin composition containing a composite wavelength conversion powder which have high utilization efficiency of light and high utilization efficiency of a constituent material, and are able to make highly efficient light emission and high reliability compatible are provided. The composite wavelength conversion powder is formed by dispersing phosphor particles having a refractive index of 1.6 or more in matrix particles containing fine magnesium fluoride particles or fine calcium fluoride particles.

In addition, a light emitting device which is able to improve utilization efficiency of light due to the phosphor particles excited by primary irradiation light emitted by a light emitting element, is able to improve the optical output of light emission by increasing an the amount of secondary irradiation light generated from the phosphor particles, and is able to suppress limit the occurrence of color unevenness or a color variation device in light emitted to the outside of the device is provided. A light emitting device (1) includes a substrate (2), a light emitting element (3) mounted on a front surface of the substrate (2), and a light transmitting member (4) formed to cover the light emitting element (3), and the light transmitting member (4) contains phosphor particles having an average particle diameter of 500 nm or less, and composite wavelength conversion particles (12) formed of inorganic particles having an average particle diameter of 500 nm or less which are transparent with respect to visible light.

12 Claims, 4 Drawing Sheets

COMPOSITE WAVELENGTH CONVERSION POWDER, RESIN COMPOSITION CONTAINING COMPOSITE WAVELENGTH CONVERSION POWDER, AND LIGHT EMITTING DEVICE

TECHNICAL FIELD

The present invention relates to a composite wavelength conversion powder and a resin composition containing a composite wavelength conversion powder, and more specifically relates to a composite wavelength conversion powder and a resin composition containing a composite wavelength conversion powder which are preferably used in various optical devices such as display devices, illuminating devices, solar power generation devices, photonic devices, and optical amplifiers, and are able to make highly efficient light emission and high reliability compatible.

In addition, the present invention relates to a light emitting device, and more specifically relates to a light emitting device which is able to make highly efficient light emission and high reliability compatible, and is able to obtain uniform light emission, for example, white light or the like having low color unevenness with a high output.

This application is based upon and claims the benefit of priority from Japanese Patent Application No. 2012-208651, filed Sep. 21, 2012 and Japanese Patent Application No. 2013-015563, filed Jan. 30, 2013; the entire contents of which are incorporated herein by reference.

BACKGROUND ART

A phosphor is used in various optical devices such as display devices, illuminating devices, solar power generation devices, photonic devices, and optical amplifiers. In particular, the phosphor which is used in a wavelength conversion film or the like of a light electromotive device such as a white light emitting element (a white LED element) or a solar battery is required to emit light (fluorescence) with a high level of efficiency by electron beam excitation of comparatively low energy of near-ultraviolet rays, blue light of visible light, or the like. In addition, in the white light emitting element or the solar light electromotive device, a wavelength conversion material which is excellent in long-term stability (low degradation over a long period of time) of the phosphor, and has a small decrease in luminance efficiency under high temperatures and high humidity is required. In particular, in an optical device using a wavelength conversion material which is excited by near-ultraviolet rays or visible light and emits visible light or infrared rays, it is necessary to make high efficiency of light emission and high reliability and excellent durability of light emission compatible.

As a phosphor material which is excited by near-ultraviolet rays or blue light and emits visible light with a high level of efficiency, a YAG-based phosphor having a garnet structure such as an yttrium aluminate garnet (YAG) is generally used. In $(Y, Tb, Gd)_3Al_5O_{12}:Ce^{3+}$ which is an example of the YAG-based phosphor, quantum efficiency is approximately 90% at room temperature. As other phosphor materials, a phosphor powder such as silicate, borate, and phosphate has been developed and proposed, but the humidity resistance or heat resistance thereof is lower than the YAG-based phosphor. In addition, as a phosphor having the same level of luminance efficiency or durability as that of the YAG-based phosphor, a nitride or an oxynitride-based phosphor has been proposed.

These phosphors are, in general, used as a wavelength conversion member by dispersing a powdery phosphor in an organic binder such as an epoxy resin or a silicone resin, or in glass or a silica-based inorganic binder.

The refractive index of such phosphor particles having high efficiency and high reliability is approximately 1.63 to 2.0, and on the other hand, the refractive index of the organic binder or the inorganic binder is less than 1.6. Therefore, scattering occurs due to a refractive index difference between the phosphor particles and the binder. For example, in an optical element which allows excitation light to be incident from a back side of a wavelength conversion member and allows emit light to be output to a front side of the wavelength conversion member, light utilization efficiency loss due to back scattering is required to be reduced. Therefore, the particle diameter of the phosphor is approximately 10 μm.

However, in a case of the phosphor particles having a particle diameter of approximately 10 μm, absorption of the excitation light and output of the emitted light are performed only in a front layer portion of the particles, and an inner portion of the particles hardly exhibits a function as a phosphor, and thus the phosphor particles are useless as a material.

Therefore, in order to improve light utilization efficiency due to the scattering of the phosphor particles, a technology in which a front surface of the phosphor particles is covered with a porous covering layer, and thus the scattering is limited in the front surface of the phosphor particles has been proposed (PTL 1).

In addition, an approach in which the light utilization efficiency loss due to the light scattering is reduced by dispersing the phosphor particles with a particle diameter shorter than the wavelength of the excitation light or the emitted light in the binder has been also proposed. For example, a luminescence material in which rare-earth metal as a light emitting center is supported on a zeolite single crystal (PTL 2), a spherical inorganic phosphor in which oxide phosphor nano-particles are dispersed in a spherical silica matrix (PTL 3), or the like has been proposed.

Further, an approach in which light scattering properties are limited by decreasing the particle diameter of the YAG-based phosphor has been also proposed.

CITATION LIST

Patent Literature

[PTL 1] PCT Japanese Translation Patent Publication No. 2011-503266
[PTL 2] Japanese Unexamined Patent Application Publication No. 2003-246981
[PTL 3] Japanese Unexamined Patent Application Publication No. 2010-155958
[PTL 4] Japanese Unexamined Patent Application Publication No. 10-247750

SUMMARY OF INVENTION

Technical Problem

However, in the technology for covering the front surface of the phosphor particles with the porous covering layer which is disclosed in PTL 1, the refractive index of the phosphor particles itself is not improved, and thus, even though the scattering is limited in the front surface of the phosphor particles, there is no effect on suppressing the scattering.

In addition, in the method of dispersing the nano-phosphor of which the particle diameter is shorter than the wavelength of the excitation light or the emitted light in the binder which is disclosed in PTL 2 and PTL 3, even though the light utilization efficiency loss due to scattering decreases, the nano-phosphor itself has a disadvantage in that luminance efficiency is considerably decreased due to a front surface defect, and further, there is a problem in reliability in that a strong influence of humidity is easily exerted, and thus the performance thereof as the wavelength conversion material becomes insufficient.

Further, in the method of limiting the light scattering properties by decreasing the particle diameter of the YAG-based phosphor, a strong influence of disarrayed crystals in the front surface of the particles is exerted by decreasing the particle diameter, and thus the luminance efficiency is also decreased to approximately 21% to 56%, and the approach is insufficient in view of practical use.

The present invention is made in consideration of the circumstances described above, and provides a composite wavelength conversion powder and a resin composition containing a composite wavelength conversion powder which have high utilization efficiency of light and high utilization efficiency of a constituent material, and are able to make highly efficient light emission and high reliability compatible.

In addition, in the related art, a light emitting device using a light emitting element such as a Light Emitting Diode (LED) is used as various light sources.

The LED is also referred to as a light emitting diode, has high power efficiency and a small size, and emits bright-colored light. In addition, the LED is a semiconductor element, and thus has a long lifetime compared to a light source using a bulb tube, and has no problem such as burned-out bulbs. Further, the LED is a semiconductor light emitting element having excellent initial drive characteristics and resistance to oscillation or repeatedly being turned ON and OFF.

As the light emitting device using the semiconductor light emitting element such as the LED, a structure in which the semiconductor light emitting element is covered with a covering portion containing a fluorescence substance is proposed and is practically provided (for example, refer to PTL 4 or the like).

As the structure of the light emitting device, a face up type light emitting device and a flip chip type light emitting device are known.

The face up type light emitting device is a light emitting device using emitted light from a surface on a side on which a light emitting element is formed, and has a configuration in which the light emitting element is mounted on a front surface of a substrate, and the light emitting element is excited by light of the light emitting element and is covered with the light transmitting member containing phosphor particles generating fluorescence.

The flip chip type light emitting device is a light emitting device using emitted light from a back surface on a side opposite to the side on which the light emitting element is formed, and has a configuration in which a light emitting element is mounted on a front surface of a substrate, and the back surface of the substrate is excited by light of the light emitting element and is covered with a light transmitting member containing phosphor particles generating fluorescence, and thus takes out a desired wavelength spectrum by performing wavelength conversion with respect to primary irradiation light from the light emitting element using the phosphor particles.

As the light transmitting member used in the light emitting device, a light transmitting member in which a phosphor is dispersed in a transparent member of a transparent resin such as a silicone resin, an epoxy resin, and a urea resin, transparent glass such as low melting point glass, and sol-gel glass, or the like which has high transmissivity with respect to light from a ultraviolet ray region to a visible light region is used.

In the light emitting device, ultraviolet rays or blue light which is primary irradiation light generated from the light emitting element by supplying a driving current to the light emitting device from an external electric circuit in order to allow the light emitting element to emit light is incident on the light transmitting member containing the phosphor particles, then absorption and scattering are repeated several times in the light transmitting member, and then the light is released to the outside. On the other hand, the ultraviolet rays or the blue light absorbed in the phosphor particles functions as an excitation light source, and generates fluorescence having a wavelength longer than that of the primary irradiation light. Thus, due to the primary irradiation light generated by the light emitting element, the phosphor particles releasing secondary irradiation light (visible light) having a wavelength longer than that of the primary irradiation light are excited, and thus the visible light having a desired wavelength spectrum is released. For example, when the secondary irradiation light by the primary irradiation light and the phosphor particles, and the secondary irradiation light of various spectrums are mixed, white light is able to be released.

However, in the light emitting device of the related art, the utilization efficiency of light of the phosphor particles with respect to the primary irradiation light of the light emitting element which is necessary for exciting the phosphor particles included in the light transmitting member decreases. This is because the primary irradiation light released from the light emitting element is reflected and scattered on the front surface of the phosphor particles, and a part of the primary irradiation light is absorbed inside the light emitting element due to the back scattering while repeating the reflection and scattering in the front surface of the phosphor particles.

In addition, when a plurality of various phosphor particles are included in the light transmitting member, due to a variation in particle size distribution of the plurality of various phosphor particles, or a variation in concentration distribution of each of the plurality of various phosphor particles in the light transmitting member, the extent of the reflection and the extent of the scattering of the primary irradiation light respectively varies, and thus it is difficult to obtain a light emitting device discharging light to the outside which has low color unevenness or a small color variation, and has a desired wavelength spectrum.

The present invention is made in consideration of the circumstances described above, and an object thereof is to provide a light emitting device which is able to improve utilization efficiency of light due to phosphor particles excited by primary irradiation light emitted by a light emitting element, is able to improve the optical output of light emission by increasing the amount of secondary irradiation light generated from the phosphor particles, and is able to limit the occurrence of color unevenness or a color variation device in light emitted to the outside of the device.

Solution to Problem

The present inventors have conducted intensive studies in order to solve the problem described above, and have found that when phosphor particles having a refractive index of 1.6 or more are dispersed in matrix particles containing fine magnesium fluoride particles or fine calcium fluoride particles, utilization efficiency of light and utilization efficiency of a constituent material increase, and it is possible to make highly efficient light emission and high reliability compatible, and thus completed the present invention.

That is, a composite wavelength conversion powder of the present invention is formed by dispersing phosphor particles having a refractive index of 1.6 or more in matrix particles containing fine magnesium fluoride particles or fine calcium fluoride particles.

The phosphor particles preferably consist of a phosphor which is excited by ultraviolet rays or visible light and emits visible light or infrared rays.

Both the average particle diameter of the fine magnesium fluoride particles or the fine calcium fluoride particles, and the average particle diameter of the phosphor particles is preferably 500 nm or less.

The percentage by mass of the phosphor particles with respect to the total mass of the matrix particles is preferably 20% to 70% by mass.

The phosphor particles preferably consist of a phosphor having a garnet structure.

A resin composition containing a composite wavelength conversion powder of the present invention is obtained by dispersing the composite wavelength conversion powder of the present invention in a resin.

In addition, the present inventors have conducted intensive studies in order to solve the problem described above, and have found that when a light transmitting member which covers either of a light emitting element mounted on one main surface of a substrate and the other main surface of the substrate contains composite wavelength conversion particles consisting of phosphor particles having an average particle diameter of 500 nm or less, and inorganic particles having an average particle diameter of 500 nm or less which are transparent with respect to ultraviolet rays or visible light, it is possible to improve utilization efficiency of light due to the phosphor particles excited by primary irradiation light emitted by the light emitting element, it is possible to improve the optical output of light emission by increasing the amount of secondary irradiation light generated from the phosphor particles, and it is possible to limit the occurrence of color unevenness or a color variation in light emitted to the outside of the device, and thus to complete the present invention.

That is, the light emitting device of the present invention includes a substrate, a light emitting element which is mounted on one main surface of the substrate, and a light transmitting member which covers either of the light emitting element and the other main surface of the substrate, and the light transmitting member contains composite wavelength conversion particles consisting of phosphor particles having an average particle diameter of 500 nm or less, and inorganic particles which have an average particle diameter of 500 nm or less and are transparent with respect to ultraviolet rays and visible light.

The light transmitting member is preferably a resin composition containing composite wavelength conversion particles consisting of the composite wavelength conversion particles contained in a resin.

The average particle diameter of the composite wavelength conversion particles or the resin composition containing the composite wavelength conversion particles is preferably 0.5 μm or more and 30 μm or less.

A refractive index of the inorganic particles is preferably 1.38 to 1.45.

The inorganic particles preferably contain one or more selected from a group consisting of magnesium fluoride, calcium fluoride, and strontium fluoride.

The phosphor particles preferably consist of a phosphor having a garnet structure.

The light transmitting member preferably contains a silicone resin having a refractive index of 1.42 to 1.55.

Advantageous Effects of Invention

According to the composite wavelength conversion powder of the present invention, the phosphor particles having a refractive index of 1.6 or more are dispersed in the matrix particles containing the fine magnesium fluoride particles or the fine calcium fluoride particles, and thus it is possible to increase the utilization efficiency of the light and utilization efficiency of the constituent material, and it is possible to emit the light with a high level of efficiency. In addition, the highly efficient light emission is stable over a long period of time, and thus it is possible to increase reliability. As described above, it is possible to make highly efficient light emission and high reliability compatible.

According to the resin composition containing the composite wavelength conversion powder of the present invention, the composite wavelength conversion powder of the present invention is disposed in the resin, and thus utilization efficiency of the light and utilization efficiency of the constituent material increase, and it is possible to make highly efficient light emission and high reliability compatible.

In addition, according to the light emitting device of the present invention, the light transmitting member formed by covering either of the light emitting element and the other main surface of the substrate contains the phosphor particles having an average particle diameter of 500 nm or less, and the composite wavelength conversion particles formed of the inorganic particles having an average particle diameter of 500 nm or less which are transparent with respect to ultraviolet rays or visible light, and thus it is possible to reduce the amount of light which is reflected and scattered on an interface of the composite wavelength conversion particles in the light transmitting member among the light emitted from the light emitting element, and it is possible to allow more primary irradiation light to be incident on an inner portion of the composite wavelength conversion particles. In addition, similarly, the secondary irradiation light emitted from the composite wavelength conversion particles is also able to reduce the reflection and scattering due to the composite wavelength conversion particles in the light transmitting member. Therefore, it is possible to improve the utilization efficiency of light due to the phosphor particles which are excited by the primary irradiation light emitted by the light emitting element, and it is possible to improve the optical output of the light emission by increasing the amount of the secondary irradiation light generated from the phosphor particles.

Further, the light transmitting member contains the phosphor particles having an average particle diameter of 500 nm or less, and the composite wavelength conversion particles formed of the inorganic particles having an average particle diameter of 500 nm or less which are transparent with respect to the ultraviolet rays or the visible light, and thus it is possible to uniformly disperse the composite wavelength conversion particles in the light transmitting member. Therefore, it is possible to decrease the influence of a concentration distribution and a particle diameter of the phosphor particles and the inorganic particles on the light transmitting member, and it is possible to limit the occurrence of color unevenness or color variation in the light emitted to the outside.

DESCRIPTION OF EMBODIMENTS

First Embodiment

Figure 1:
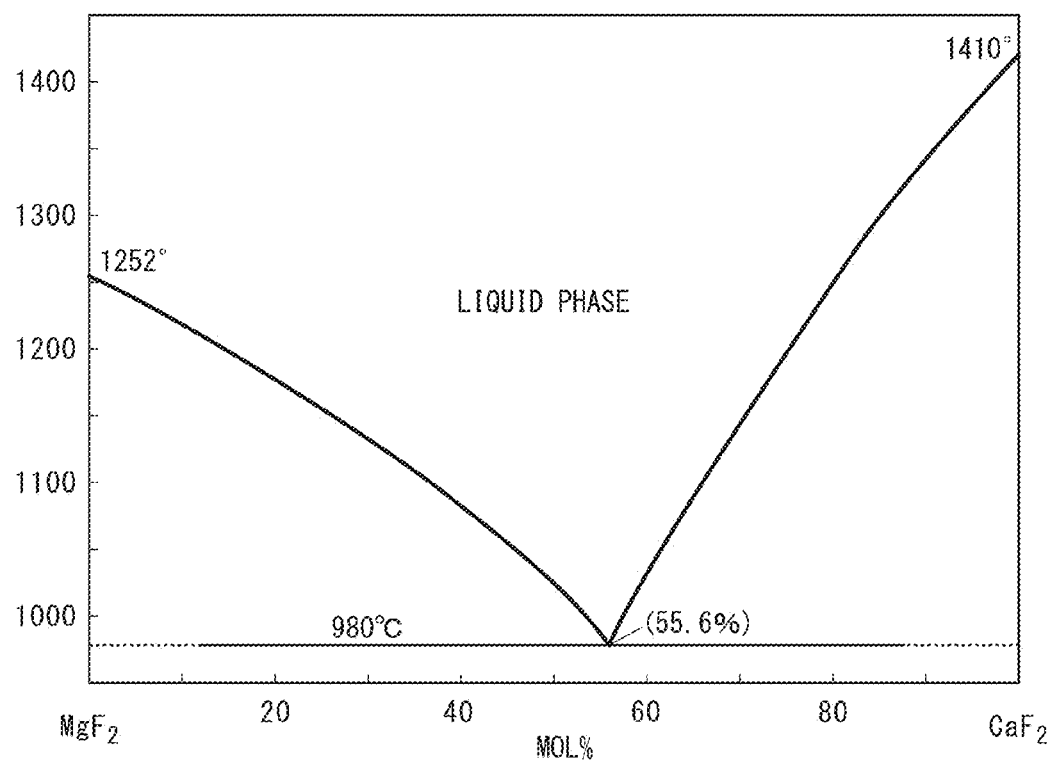
FIG. 1 is a diagram showing a state graph of magnesium fluoride-calcium fluoride.

Embodiments of a composite wavelength conversion powder and a resin composition containing a composite wavelength conversion powder of the present invention will be described.

Furthermore, the following embodiments are specifically described in order to easily understand the gist of the invention, and unless particularly noted, they do not limit the present invention.

Composite Wavelength Conversion Powder

A composite wavelength conversion powder of this embodiment is a powder formed by dispersing phosphor particles having a refractive index of 1.6 or more in matrix particles containing fine magnesium fluoride particles or fine calcium fluoride particles.

Here, the reason that the fine magnesium fluoride particles (a refractive index: 1.38) or the fine calcium fluoride particles (a refractive index: 1.43) are used as a material configuring the matrix particles is because the refractive indexes thereof are low, and durability characteristics such as heat resistance and chemical resistance are excellent.

The fine magnesium fluoride particles or the fine calcium fluoride particles are able to be used together with strontium fluoride (a refractive index: 1.44) or amorphous silica (a refractive index: 1.45). In addition, fine strontium fluoride particles (a refractive index: 1.44) may be used instead of the fine magnesium fluoride particles or the fine calcium fluoride particles.

In the composite wavelength conversion powder, by dispersing the phosphor particles having a refractive index of 1.6 or more in the matrix particles containing the fine magnesium fluoride particles or the fine calcium fluoride particles, it is possible to limit the refractive index of the entire powder to be a desired refractive index of, for example, 1.6 or less.

The refractive index of the composite wavelength conversion powder is able to be limited by changing the proportion of the fine magnesium fluoride particles or the fine calcium fluoride particles configuring the matrix particles and the phosphor particles, that is, the proportion of mass of the fine magnesium fluoride particles or the fine calcium fluoride particles and mass of the phosphor particles.

Furthermore, the refractive index of the composite wavelength conversion powder is also changed due to the refractive index or the amount of the phosphor particles contained therein, and for example, when the refractive index of the matrix particles is 1.45 or less, in order to set the refractive index of the entire powder to be 1.6 or less, more phosphor particles are contained, which is preferable.

The average particle diameter of the fine magnesium fluoride particles or the fine calcium fluoride particles is preferably 500 nm or less, and is more preferably 300 nm or less, or is less than or equal to the length of an excitation wavelength.

Here, when the average particle diameter exceeds 500 nm, Mie scattering occurs due to a refractive index difference between the fine magnesium fluoride particles or the fine calcium fluoride particles and the phosphor particles, and the utilization efficiency of the excitation light is decreased, which is not preferable.

The fine magnesium fluoride particles or the fine calcium fluoride particles are able to be prepared by using a known method. For example, by mixing an aqueous ammonium fluoride solution, an aqueous magnesium chloride solution, or an aqueous calcium chloride solution, the fine magnesium fluoride particles or the fine calcium fluoride particles are able to be formed in a colloidal shape. Therefore, it is possible to simply prepare the fine magnesium fluoride particles or the fine calcium fluoride particles by using a simple device.

The phosphor particles described above are particles including a phosphor which is excited by ultraviolet rays having a wavelength band of 300 nm to 400 nm, or visible light having a wavelength band of 400 nm to 500 nm, and emits ultraviolet rays having a wavelength band of 350 nm to 400 nm, visible light having a wavelength band of 400 to 700 nm, or infrared rays having a wavelength band exceeding 700 nm.

As the phosphor particles, phosphor particles in which a base material such as oxide, halide, phosphate, vanadate, tungstate, molybdate, and sulfide is doped with light emitting ions such as a rare-earth ion or a transition metal ion, phosphor particles formed of rare-earth metal oxide, phosphor particles of a composite compound of rare-earth metal, and the like are included.

Here, as a substance to be a base material, for example, a simple oxide expressed by (1) general formula: $R_2O_3$ (wherein, R is one or two or more selected from a group consisting of Y, La, Gd, Sc, and Lu), a composite oxide expressed by (2) general formula: $(R_1)(R_2)_2O_4$ (wherein, $R_1$ is an alkaline-earth metal element, and $R_2$ is one or two or more selected from a group consisting of Y, La, Gd, Sc, and Lu), a simple oxide expressed by (3) general formula: $RO_2$ (wherein, R is one or two or more selected from a group consisting of Ti, Sn, Ce, and Zr), and a simple oxide expressed by (4) general formula: $R_2O_5$ (wherein, R is one or two or more selected from a group consisting of Ta, Nb, and V) are able to be included.

In addition, as a silicate-based oxide, a silicate-based composite oxide expressed by (5) general formula: $RSi_2O_5$ (wherein, R is one or two or more selected from a group consisting of Y, Gd, and Lu), a silicate-based composite oxide expressed by (6) general formula: $R_2SiO_4$ (wherein, R is one or two or more selected from a group consisting of Zn, Mg, Ca, Sr, Mn, Ba, and a rare-earth element), a silicate-based composite oxide expressed by (7) $CaMgSi_3O_6$, and a silicate-based composite oxide expressed by (8) general formula: $(R_1, R_2)ZrSi_3O_9$ (wherein, $R_1$ and $R_2$ are one or two or more selected from a group consisting of Zn, Mg, Ca, Sr, Ba, and a rare-earth element) are able to be included.

In addition, as other composite oxides, a composite oxide which is expressed by (9) general formula $A_3B_5O_{12}$ (wherein, A is a trivalent metal element, and B is a trivalent metal element) or a general formula $C_3D_2E_5O_{12}$ (wherein, C is a bivalent metal element, D is a trivalent metal element, and E is a tetravalent metal element), and has a garnet structure identical to a crystalline structure of a garnet of a natural mineral is included.

As each element of A to E, for example, A is preferably a trivalent metal element such as Y, Sc, and Bi or a rare-earth metal element, B is preferably a trivalent metal element such as Al, Ga, and Sc, C is preferably an alkaline-earth metal or a bivalent transition metal element, D is preferably a trivalent transition metal element such as Y and Sc or a rare-earth metal element, and E is preferably a tetravalent element such as Si or Ge.

As the other composite oxides, aluminate-based composite oxide expressed by (10) general formula: $RAl_2O_4$ (wherein, R is one or two or more selected from a group consisting of Zn, Mg, Ca, Sr, and Ba) is able to be included.

Further, as the other composite oxides, a composite oxide expressed by (11) general formula: $YRO_4$ (wherein, R is one or two or more selected from a group consisting of Ta, Nb, and V), and a composite oxide expressed by (12) general formula: $RVO_3$ (wherein, R is one or two or more selected from a group consisting of Cs and Rb) are able to be included.

Here, the alkaline-earth metal elements are four elements including Ca, Sr, Ba, and Ra which are group II elements in the periodic table, and it is preferable that one or two or more selected from the group consisting of the four elements described above be included as a main component.

In addition, the rare-earth element is one of the 15 elements including La, Ce, Pr, Nd, Pm, Sm, Eu, Gd, Tb, Dy, Ho, Er, Tm, Yb, and Lu which is in the lanthanide series, and it is preferable that one or more selected from a group consisting of the 15 elements be included as a main component.

Among the phosphor particles, a phosphor having a garnet structure, for example, an yttrium aluminum garnet (YAG:Ce) to which Ce is added, a terbium aluminum garnet (TAG:Ce) to which Ce is added, a calcium scandium silicate garnet ($Ca_3Sc_2Si_3O_{12}$:Ce) to which Ce is added, and the like are preferable.

The phosphor particles are able to be synthesized by a common solid phase method, a sol-gel method, a co-precipitation method, a uniform precipitation method, a solvothermal method, a combustion method, a complex polymerization method, or the like.

The average particle diameter of the phosphor particles is preferably 500 nm or less, and is more preferably 20 nm or more and 300 nm or less.

Here, the reason that the average particle diameter of the phosphor particles is within the range described above is because the refractive index of the phosphor particles is within a range of 1.6 to 2.0, and thus when the average particle diameter of the phosphor particles exceeds 500 nm, Mei scattering occurs due to the refractive index difference between the matrix and the phosphor particles, as a result, back scattering of the excitation light due to the phosphor particles increases, and luminance efficiency at the time of forming the resin composition by dispersing the phosphor particles in the resin decreases, which is not preferable. Furthermore, when the average particle diameter of the phosphor particles is less than 20 nm, the absorption efficiency of the light of the phosphor particles decreases, which is not preferable.

As described above, a more preferable range of the average particle diameter of the phosphor particles is 20 nm or more and 300 nm or less.

The composite wavelength conversion powder of this embodiment is in a state where the phosphor particles described above are dispersed in the matrix configured of particles having a refractive index lower than that of the phosphor particles.

That is, the composite wavelength conversion powder of this embodiment has a composite structure of the phosphor particles as described above and the matrix configured of the particles having the refractive index lower than that of the phosphor particles.

In the composite wavelength conversion powder, the phosphor particles described above have a structure in which the phosphor particles are maintained between the precise fine magnesium fluoride particles or the precise fine calcium fluoride particles configuring the matrix, and thus most phosphor particles are able to be in a state where the phosphor particles are not in contact with an external atmosphere (air, water vapor, and the like) with the exception of the phosphor particles in the front surface of the composite wavelength conversion powder.

Further, due to a difference in the rate of thermal expansion between the phosphor particles described above and the precise fine magnesium fluoride particles or the precise fine calcium fluoride particles configuring the matrix, the phosphor particles are maintained in the matrix in a state where large compressive stress is exerted on the phosphor particles, and thus the phosphor particles are able to have high light emitting properties even when the phosphor particles are nano-particles.

Here, "precise" indicates a particle state where porosity of magnesium fluoride or calcium fluoride with respect to theoretical density (real density) is 20% or less, and is preferably 15% or less.

The composite wavelength conversion powder is usually used by being mixed with a resin, and thus it is preferable that the shape thereof be spherical.

The content rate of the phosphor particles in the composite wavelength conversion powder is preferably 20% to 70% by mass with respect to the total mass of the composite wavelength conversion powder, and is more preferably 20% to 60% by mass.

Here, when the content rate of the phosphor particles is less than 20% by mass, the amount of the phosphor particles is excessively reduced, and wavelength conversion performance is degraded, and thus it is impractical. In contrast, when the content rate of the phosphor particles exceeds 70% by mass, the number of phosphor particles exposed in the front surface of the composite wavelength conversion powder increases, the exposed phosphor particles are influenced by an external atmosphere, and durability or another property is degraded, which is not preferable.

The average particle diameter of the composite wavelength conversion powder is not particularly limited, and when various resins and a composite body are configured, the average particle diameter of the composite wavelength conversion powder is preferably within a range of 1 μm to 50 μm from the viewpoint of ease of preparing the composite body.

The composite wavelength conversion powder is able to be obtained by mixing the fine magnesium fluoride particles or the fine calcium fluoride particles having an average particle diameter of 500 nm or less and a precursor of the phosphor particles described above, by uniformly dispersing the precursor between the fine magnesium fluoride particles or the fine calcium fluoride particles, by performing a heat treatment with respect to the obtained mixture at a temperature range higher than or equal to a temperature at which the phosphor particles are created and crystallized, by creating the phosphor particles between the fine magnesium fluoride particles or the fine calcium fluoride particles, and by performing a heat treatment or a heat reduction treatment with respect to the phosphor particles at a temperature lower than the melting point of magnesium fluoride or calcium fluoride as shown in FIG. 1.

Furthermore, when the heat treatment temperature or the heat reduction treatment temperature is higher than or equal to the melting point of magnesium fluoride or calcium fluoride, the phosphor particles and the fine magnesium fluoride particles or the fine calcium fluoride particles are concurrently grown and are coarsened, which is not preferable.

In the composite wavelength conversion powder of this embodiment, the phosphor particles of which the refractive index is 1.6 or more and the average particle diameter is approximately less than or equal to an excitation and emit wavelength have a composite particle structure in which the phosphor particles are dispersed in the matrix particles containing the fine magnesium fluoride particles (n=1.38) or the fine calcium fluoride particles (n=1.43) which are precise, and have high chemical and thermal stability and a low refractive index, and thus the refractive index of the composite wavelength conversion powder becomes a refractive index expressed by a volume fraction of the fine magnesium fluoride particles or the fine calcium fluoride particles and the phosphor particles according to an effective-medium theory, and when the composite wavelength conversion powder is dispersed in the binder, it is possible to reduce the refractive index difference between the composite wavelength conversion powder and the binder, and it is possible to increase the utilization efficiency of the light.

In addition, utilization efficiency of the phosphor particles is maximized, and further, the phosphor particles are embedded in a state where the phosphor particles are dispersed in the precise matrix, and thus high reliability is able to be secured.

Resin Composition Containing Composite Wavelength Conversion Powder

A resin composition containing the composite wavelength conversion powder of this embodiment is a resin composition formed by dispersing the composite wavelength conversion powder of this embodiment in the resin.

In this resin composition, in order to reduce the refractive index difference between the composite wavelength conversion powder and the resin described above, to limit the back scattering, and to improve the utilization efficiency of the light, it is preferable that the refractive index of the composite wavelength conversion powder be 1.6 or less.

As the resin, a resin having transparency with respect to a wavelength band of target light may be used, and a thermoplastic resin, and a curable resin such as a thermosetting resin, a photo (electromagnetic wave) curable resin which is cured with visible light, ultraviolet rays, infrared rays, or the like, and an electron beam curable resin which is cured with electron beam irradiation are preferably used.

As the resin, for example, an epoxy resin, a silicone resin, an acryl resin, a polyester resin, a fluorine resin, a polyethylene resin, a polypropylene resin, a polystyrene resin, a nylon resin, a polyacetal resin, a polyethylene terephthalate resin, a polyimide resin, a liquid crystal polymer, a polyether sulfone resin, a polysulfone resin, a polycarbonate resin, a butyral resin, and the like are included. In particular, the silicone resin has excellent heat resistance and light resistance, and further has high affinity with the composite wavelength conversion powder, and thus is preferable.

As the silicone resin, for example, a dimethyl silicone resin, a methyl phenyl silicone resin, a vinyl group-containing silicone resin, an amino group-containing silicone resin, a methacryl group-containing silicone resin, a carboxy group-containing silicone resin, an epoxy group-containing silicone resin, a carbinol group-containing silicone resin, a phenyl group-containing silicone resin, an organohydrogen silicone resin, an alicyclic epoxy group modified silicone resin, a polycyclic hydrocarbon-containing silicone resin, an aromatic hydrocarbon-containing silicone resin, a phenyl-silsesquioxane resin, and the like are included.

In general, these resins are independently used, and are able to be used by combining two or more resins according to usage.

As described above, according to the composite wavelength conversion powder of the embodiment, the phosphor particles having a refractive index of 1.6 or more are dispersed in the matrix particles containing the fine magnesium fluoride particles or the fine calcium fluoride particles, and thus it is possible to increase the utilization efficiency of the light and the utilization efficiency of the constituent material, and it is possible to emit the light with a high level of efficiency. In addition, the highly efficient light emission is stable over a long period of time, and thus it is possible to increase reliability. As described above, it is possible to make the highly efficient light emission and high reliability compatible.

According to the resin composition containing the composite wavelength conversion powder of the embodiment, the composite wavelength conversion powder of this embodiment is dispersed in the resin, and thus it is possible to increase the utilization efficiency of light and the utilization efficiency of the constituent material, and it is possible to make the highly efficient light emission and high reliability compatible.

EXAMPLE

Hereinafter, the present invention will be specifically described by Examples and Comparative Example, but the present invention is not limited to those Examples.

Example 1

Preparation of Magnesium Fluoride Colloid 406.6 g of magnesium chloride 6 hydrate ($MgCl_2 \cdot 6H_2O$) was dissolved in 2000 g of pure water (a room temperature: 25° C.), and an aqueous magnesium chloride solution was prepared. Subsequently, an aqueous ammonium fluoride solution in which 148.2 g of ammonium fluoride ($NH_4F$) was dissolved in 2000 g of pure water (a room temperature: 25° C.) was added to the solution while being stirred, and magnesium fluoride particles were obtained.

Next, a solution including the magnesium fluoride particles was subjected to ultrafiltration cleaning, and impurity ions in the solution were removed, then the solution was condensed, and thus a magnesium fluoride colloid including 2% by mass of magnesium fluoride ($MgF_2$) particles was prepared.

The dispersed particle diameter of the magnesium fluoride colloid was 30 nm, and the crystalline diameter of the magnesium fluoride ($MgF_2$) particles was 8 nm.

Preparation of Phosphor Precursor Solution Having Garnet Structure

As a precursor of the phosphor particles, a rare-earth aluminate-based phosphor precursor solution was prepared.

Here, as the phosphor having a garnet structure, a YAG:Ce phosphor was selected, and as a precursor of the YAG:Ce phosphor, an aqueous glyoxylic acid solution (a glyoxylic acid complex aqueous solution) of Al, Y, and Ce was prepared. Furthermore, in the precursor of the YAG:Ce phosphor, the concentration of Ce ions which are light emitting ions was 8 mol % with respect to Y ions.

First, 72.03 g of ammonium carbonate ($NH_4HCO_3$) was dissolved in 1000 g of pure water, and an aqueous ammonium carbonate solution was prepared.

Next, 61.91 g of aluminum nitrate 9 hydrate ($Al(NO_3)_3 \cdot 9H_2O$: molecular weight of 375.13), 34.89 g of yttrium nitrate 6 hydrate ($Y(NO_3)_3 \cdot 6H_2O$: molecular weight of 383.01), and 3.44 g of cerium nitrate 6 hydrate ($Ce(NO_3)_3 \cdot 6H_2O$: molecular weight of 434.23) were dissolved in 1000 g of pure water (a room temperature: 25° C.), and an aqueous nitrate solution was prepared.

Next, the aqueous nitrate solution described above was added to the aqueous ammonium carbonate solution described above, a precipitate of hydroxy carbonate of Al, Y, and Ce was prepared, the precipitate was cleaned by using a ultrafiltration device, the impurity ions were removed, then solid-liquid separation was performed with respect to the precipitate in a vacuum filtration device, and the obtained cake was dried at 120° C. for 24 hours, and thus a dry powder of the hydroxy carbonate of Al, Y, and Ce was obtained. Next, 33.9 g of the dry powder (20 g in terms of YAG:Ce) was added to 466.1 g of the aqueous glyoxylic acid solution including 58.6 g of glyoxylic acid, then was stirred at a room temperature (25° C.) for 24 hours, and thus an aqueous glyoxylic acid solution of Al, Y, and Ce was prepared.

Preparation of Composite Wavelength Conversion Powder 200 g of the magnesium fluoride colloid described above was put into 150 g of the aqueous glyoxylic acid solution of Al, Y, and Ce, was stirred and mixed, and was dried with a double fluid nozzle type spray dryer, and then the obtained powder was subjected to a heat treatment at 550° C. for 2 hours in an air atmosphere.

Figure 2:
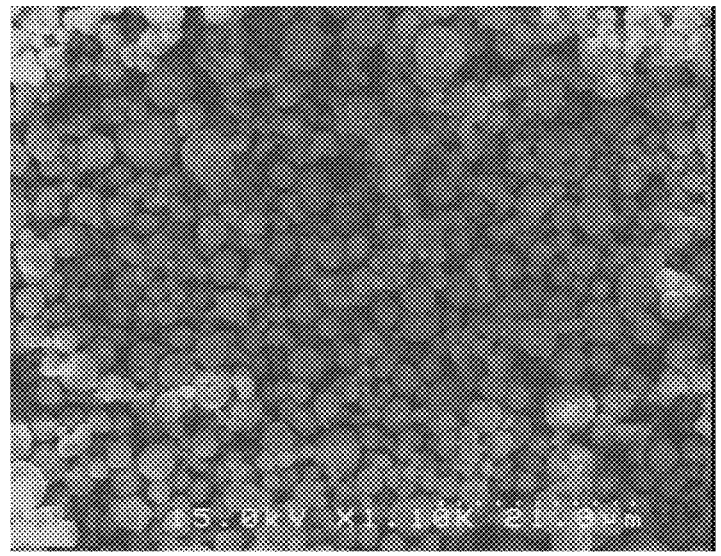
FIG. 2 is a scanning electron microscope (SEM) image showing a composite wavelength conversion powder of Example 1 according to the present invention.

Further, in a 5% hydrogen-95% nitrogen atmosphere, the powder was subjected to a heat treatment at 1200° C. for 5 hours, and thus the composite wavelength conversion powder of Example 1 was prepared. The particle diameter of the powder was observed by a scanning electron microscope (SEM), and as a result, the particle diameter was found to be distributed in a range of 1 μm to 8 μm. A scanning electron microscope (SEM) image of the composite wavelength conversion powder is shown in FIG. 2.

Preparation and Evaluation of Resin Composition Containing Composite Wavelength Conversion Powder The composite wavelength conversion powder described above and a silicone resin SCR-1011 (two-liquid type: manufactured by Shin-Etsu Chemical Co., Ltd.) were weighed such that the mass ratio of composite wavelength conversion powder described above and the silicone resin was 30:70, and then were kneaded in an agate mortar.

Next, the kneaded material was coated on a transparent glass substrate by an applicator, and then was cured by being heated at 130° C. for 60 minutes, and thus a wavelength conversion film of Example 1 for measuring light emitting intensity having a thickness of 100 μm was formed on the transparent glass substrate.

In contrast, as a wavelength conversion film for measuring light emitting intensity for comparison, a wavelength conversion film for measuring light emitting intensity for comparison having a thickness of 100 μm was formed on a transparent glass substrate by the same method as that of the wavelength conversion film of Example 1 except that a commercially available YAG:Ce phosphor P46-Y3 (manufactured by Kasei Optonix Co., Ltd. (a former name)) was used.

Figure 3:
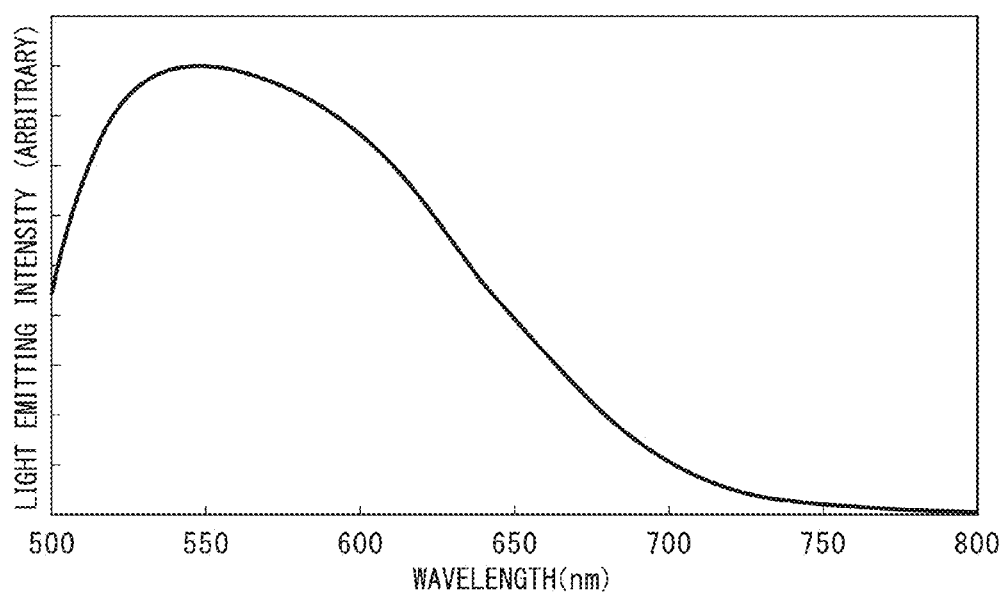
FIG. 3 is a diagram showing a light emitting spectrum of a wavelength conversion film of Example 1 according to the present invention.

Next, the quantum efficiency of a light emitting spectrum of each of the wavelength conversion film of Example 1 and the wavelength conversion film for comparison was measured by a transmission method using a quantum efficiency measurement system QE2100 (manufactured by Otsuka Denshi Co., Ltd.). Here, excitation light was incident from a back side (a glass substrate side) of the wavelength conversion film, and the light emitting spectrum of a front side of the wavelength conversion film was focused by an integrating sphere, and thus quantum efficiency of the light emitting spectrum of 560 nm with respect to the excitation light of 460 nm was measured. The light emitting quantum efficiency of the wavelength conversion film of Example 1 with respect to the front side was 0.53. In the wavelength conversion film for comparison, the light emitting quantum efficiency was 0, and the light emission of the wavelength conversion film with respect to the front side was not confirmed. The light emitting spectrum of the wavelength conversion film of Example 1 is shown in FIG. 3.

Example 2

Preparation of Calcium Fluoride Colloid 376.6 g of calcium chloride 2 hydrate ($CaCl_2 \cdot 2H_2O$) was dissolved in 9624 g of pure water (room temperature: 25°

C.), and an aqueous calcium chloride solution was prepared. Subsequently, an aqueous ammonium fluoride solution in which 190 g of ammonium fluoride ($NH_4F$) was dissolved in 9810 g of pure water (a room temperature: 25° C.) was added to the solution while being stirred, and calcium fluoride particles were obtained.

Next, a solution including the calcium fluoride particles was subjected to ultrafiltration cleaning, and impurity ions in the solution were removed, then the solution was condensed, and thus a calcium fluoride colloid including 2% by mass of calcium fluoride ($CaF_2$) particles was prepared.

The dispersed particle diameter of the calcium fluoride colloid was 80 nm, and the crystalline diameter of the calcium fluoride ($CaF_2$) particles was 20 nm.

Preparation of Phosphor Precursor Solution Having Garnet Structure

On the basis of Example 1, as a precursor of the phosphor particles, an aqueous glyoxylic acid solution of Al, Y, and Ce was prepared.

Preparation of Composite Wavelength Conversion Powder 200 g of the calcium fluoride colloid described above was put into 42.9 g of the aqueous glyoxylic acid solution of Al, Y, and Ce, and was stirred and mixed, and was dried with a double fluid nozzle type spray dryer, then the obtained powder was subjected to a heat treatment at 600° C. for 2 hours in an air atmosphere.

Further, in a 5% hydrogen-95% nitrogen atmosphere, the powder was subjected to a heat treatment at 1300° C. for 5 hours, and thus the composite wavelength conversion powder of Example 2 was prepared. The particle diameter of the powder was observed by a scanning electron microscope (SEM), and as a result thereof, the particle diameter was distributed in a range of 1 µm to 8 µm.

Preparation and Evaluation of Resin Composition Containing Composite Wavelength Conversion Powder On the basis of Example 1, a wavelength conversion film for measuring light emitting intensity of Example 2 was formed by using the composite wavelength conversion powder of Example 2.

Then, the light emitting spectrum of the wavelength conversion film of Example 2 was measured on the basis of Example 1.

As a measurement result, the light emitting quantum efficiency of the wavelength conversion film of Example 2 with respect to a front side was 0.57.

Example 3

Preparation of Composite Wavelength Conversion Powder 200 g of the calcium fluoride colloid prepared on the basis of Example 2 was input into 66.7 g of the aqueous glyoxylic acid solution of Al, Y, and Ce prepared on the basis of Example 2, and was stirred and mixed, and was dried with a double fluid nozzle type spray dryer, then the obtained powder was subjected to a heat treatment at 600° C. for 2 hours in an air atmosphere.

Further, in a 5% hydrogen-95% nitrogen atmosphere, the powder was subjected to a heat treatment at 1300° C. for 5 hours, and thus the composite wavelength conversion powder of Example 3 was prepared. The particle diameter of the powder was observed with a scanning electron microscope (SEM), and as a result thereof, the particle diameter was found to be distributed in a range of 1 µm to 8 µm.

Preparation and Evaluation of Resin Composition Containing Composite Wavelength Conversion Powder On the basis of Example 1, a wavelength conversion film for measuring light emitting intensity of Example 3 was formed by using the composite wavelength conversion powder of Example 3.

Then, a light emitting spectrum of the wavelength conversion film of Example 3 was measured on the basis of Example 1.

As a measurement result, the value of light emitting quantum efficiency of the wavelength conversion film of Example 3 with respect to a front side was 0.49.

Example 4

Preparation of Composite Wavelength Conversion Powder 200 g of the calcium fluoride colloid prepared on the basis of Example 2 was input into 100 g of the aqueous glyoxylic acid solution of Al, Y, and Ce prepared on the basis of Example 2, and was stirred and mixed, and was dried with a double fluid nozzle type spray dryer, and then the obtained powder was subjected to a heat treatment at 600° C. for 2 hours in an air atmosphere.

Further, in a 5% hydrogen-95% nitrogen atmosphere, the powder was subjected to a heat treatment at 1300° C. for 5 hours, and thus the composite wavelength conversion powder of Example 4 was prepared. The particle diameter of the powder was observed with a scanning electron microscope (SEM), and as a result thereof, the particle diameter was found to be distributed in a range of 1 µm to 8 µm.

Preparation and Evaluation of Resin Composition Containing Composite Wavelength Conversion Powder On the basis of Example 1, a wavelength conversion film for measuring light emitting intensity of Example 4 was formed by using the composite wavelength conversion powder of Example 4.

Then, the light emitting spectrum of the wavelength conversion film of Example 4 was measured on the basis of Example 1.

As a measurement result, a value of light emitting quantum efficiency of the wavelength conversion film of Example 4 with respect to a front side was 0.45.

Example 5

Preparation of Composite Wavelength Conversion Powder

A colloid solution in which 40 g of the calcium fluoride colloid prepared on the basis of Example 1 and 160 g of the calcium fluoride colloid prepared on the basis of Example 2 are mixed was put into 100 g of the aqueous glyoxylic acid solution of Al, Y, and Ce of Example 2, and was stirred and mixed, and was dried with a double fluid nozzle type spray dryer, and then the obtained powder was subjected to a heat treatment at 550° C. for 2 hours in an air atmosphere.

Further, in a 5% hydrogen-95% nitrogen atmosphere, the powder was subjected to a heat treatment at 1200° C. for 5 hours, and thus a composite wavelength conversion powder of Example 5 was prepared. The particle diameter of the powder was observed with a scanning electron microscope (SEM), and as a result thereof, the particle diameter was found to be distributed in a range of 1 μm to 8 μm.

Preparation and Evaluation of Resin Composition Containing Composite Wavelength Conversion Powder On the basis of Example 1, a wavelength conversion film for measuring light emitting intensity of Example 5 was formed by using the composite wavelength conversion powder of Example 5.

Then, a light emitting spectrum of the wavelength conversion film of Example 5 was measured on the basis of Example 1.

As a measurement result, the value of light emitting quantum efficiency of the wavelength conversion film of Example 5 with respect to a front side was 0.48.

Example 6

Preparation of Composite Wavelength Conversion Powder

On the same basis of Example 1, an aqueous glyoxylic acid solution of Al, Tb, and Ce of Example 6 was prepared except that 41.27 g of terbium nitrate 6 hydrate ($Tb(NO_3)_3 \cdot 6H_2O$: molecular weight of 453.03) was used instead of 34.89 g of yttrium nitrate 6 hydrate ($Y(NO_3)_3 \cdot 6H_2O$: molecular weight of 383.01) as in Example 1.

Next, 200 g of the calcium fluoride colloid prepared on the basis of Example 2 was put into 42.9 g of the aqueous glyoxylic acid solution of Al, Tb, and Ce described above, and was stirred and mixed, and was dried with a double fluid nozzle type spray dryer, and then the obtained powder was subjected to a heat treatment at 600° C. for 2 hours in an air atmosphere.

Further, in a 5% hydrogen-95% nitrogen atmosphere, the powder was subjected to a heat treatment at 1300° C. for 5 hours, and thus the composite wavelength conversion powder of Example 6 was prepared. The particle diameter of the powder was observed with a scanning electron microscope (SEM), and as a result thereof, the particle diameter was found to be distributed in a range of 1 μm to 8 μm.

Preparation and Evaluation of Resin Composition Containing Composite Wavelength Conversion Powder On the basis of Example 1, a wavelength conversion film for measuring the light emitting intensity of Example 6 was formed by using the composite wavelength conversion powder of Example 6.

Then, a light emitting spectrum of the wavelength conversion film of Example 6 was measured on the basis of Example 1.

As a measurement result, the value of light emitting quantum efficiency of the wavelength conversion film of Example 6 with respect to a front side was 0.42.

Second Embodiment

Figure 4:
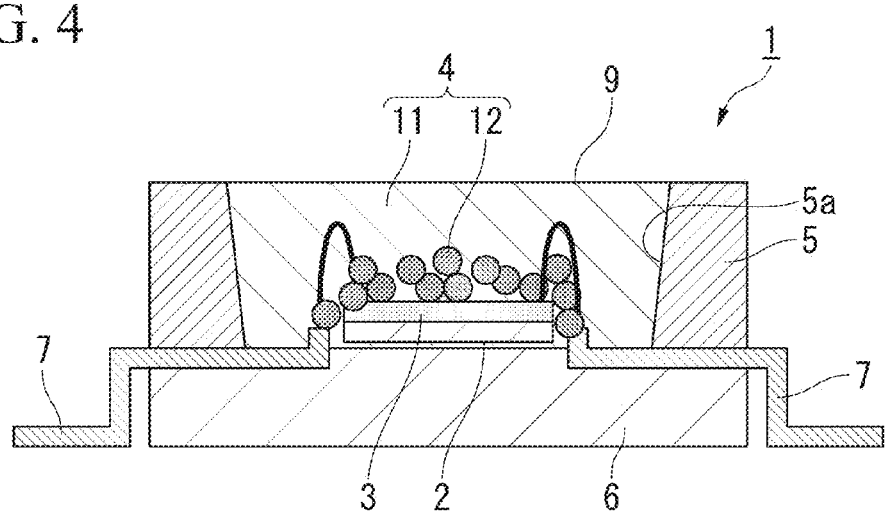
FIG. 4 is a cross-sectional view showing a face up type light emitting device of a second embodiment according to the present invention.

FIG. 4 is a cross-sectional view showing a face up type light emitting device of a second embodiment according to the present invention, and in the drawing, a reference numeral "1" refers to a light emitting device which includes a substrate 2, a light emitting element 3 mounted on a front surface (one main surface) of the substrate 2, a light transmitting member 4 formed by covering the light emitting element 3, a frame body 5 formed to surround the light transmitting member 4, a base 6 fixing the frame body 5, and electric drive wiring 7 disposed to protrude toward the outside from an upper surface of the base 6.

As the substrate 2, for example, an alumina substrate, a silicon carbide substrate, a metallic substrate of which a front surface is covered with an insulative coating film, and the like are included insofar as the light emitting element 3 is able to be mounted on the substrate 2.

A peak wavelength of energy discharged by the light emitting element 3 may be in a wavelength band from ultraviolet rays to infrared rays, and in order to release white light or various-colored light with high sense of seeing, light having a wavelength band of 300 nm or more and 500 nm or less, that is, light having a wavelength band from near-ultraviolet rays to blue light is preferable. As the light emitting element, for example, a light emitting element having a laminated structure formed of a p-type layer-a light emitting layer-an n-type layer is preferably used.

The light emitting element 3 includes a metal electrode formed of Au, Ag, or the like on the p-type layer or the n-type layer, and the metal electrode is electrically connected to the electric drive wiring 7 of the base 6 by a bonding wire 8 through a solder bump such as Au—Sn, Sn—Ag, Sn—Ag—Cu, and Sn—Pb or a metal bump such as Au or Ag.

The light transmitting member 4 contains composite wavelength conversion particles 12 in a transparent member 11.

As the transparent member 11, a silicone resin (a refractive index: 1.41 to 1.53) having high transmissivity with respect to the light from a ultraviolet ray region to an infrared region, a resin such as an epoxy resin (a refractive index: 1.52 to 1.58) having transparency, low melting point glass (a refractive index: 1.5 to 1.6), and glass such as sol-gel glass (a refractive index: 1.45 to 1.55) having transparency are preferably used.

The transparent member 11 may be suitably selected in consideration of thermal expansion coefficient or the like of the substrate 2, the light emitting element 3, the base 6, and the electric drive wiring 7, but is not particularly limited, and it is necessary to select the transparent member 11 by considering a refractive index difference in the contained composite wavelength conversion particles 12 to be 0.1 or less.

Figure 5:
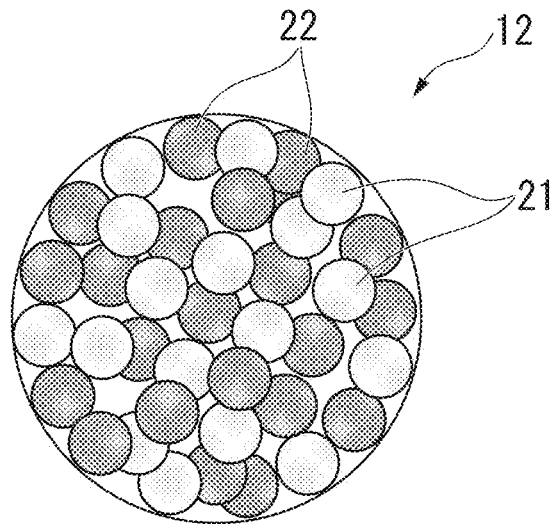
FIG. 5 is a cross-sectional view showing composite wavelength conversion particles of the second embodiment according to the present invention.

As shown in FIG. 5, the composite wavelength conversion particles 12 are configured of phosphor particles 21 having an average particle diameter of 500 nm or less, preferably of 20 nm to 300 nm, and a refractive index of 1.6 or more, and inorganic particles 22 having an average particle diameter of 500 nm or less, preferably of 300 nm or less or less than or equal to the length of an excitation wavelength which are transparent with respect to ultraviolet rays or visible light.

The phosphor particles 21 are particles including a phosphor which are excited by ultraviolet rays having a wavelength band of 300 nm to 400 nm, or visible light having a wavelength band of 400 nm to 500 nm, and emits ultraviolet rays having a wavelength band of 350 nm to 400 nm, visible light having a wavelength band of 400 to 700 nm, or infrared rays having a wavelength band exceeding 700 nm.

As the phosphor particles, for example, a garnet-based phosphor, a silicate-based phosphor, an alkaline earth aluminate-based phosphor, a sulfide phosphor, an acid halide phosphor, a phosphate phosphor, a compound semiconductor phosphor, and the like are included.

Here, as the garnet-based phosphor, a phosphor in which composite oxide which is expressed by a general formula: $A_3D_5O_{12}$ (wherein, A is a trivalent metal element, and D is a trivalent metal element), or a general formula: $E_3G_2H_5O_{12}$ (wherein, E is a bivalent metal element, G is a trivalent metal element, and H is a tetravalent metal element) and is a garnet structure identical to or approximately identical to a crystalline structure having a garnet of a natural mineral is abase material, and the base material is doped with light emitting ions such as a rare-earth ion and a transition metal ion is included.

As each element of A to H described above, for example, A is preferably a trivalent metal element such as Y, Sc, and Bi or a rare-earth metal element, D is preferably a trivalent metal element such as Al, Ga, and Sc, E is preferably an alkaline-earth metal or a bivalent transition metal element, G is preferably a trivalent transition metal element such as Y and Sc or a rare-earth metal element, and H is preferably a tetravalent transition metal element such as Si and Ge.

As the silicate-based phosphor, a phosphor in which silicate-based composite oxide which is expressed by a general formula: $RSi_2O_5$ (wherein, R is one or two or more selected from a group consisting of Y, Gd, and Lu), a general formula: $R_2SiO_4$ (wherein, R is one or two or more selected from a group consisting of Zn, Mg, Ca, Sr, Mn, Ba, and a rare-earth element), $CaMgSi_3O_6$, or a general formula: $(R_1, R_2)ZrSi_3O_9$ (wherein, $R_1$ and $R_2$ are one or two or more selected from a group consisting of Zn, Mg, Ca, Sr, Ba, and a rare-earth element) is a base material, and the base material is doped with light emitting ions such as a rare-earth ion and a transition metal ion is included.

As the alkaline earth aluminate-based phosphor, a phosphor in which aluminate-based composite oxide which is expressed by a general formula: $RAl_2O_4$ (wherein, R is one or two or more selected from a group consisting of Zn, Mg, Ca, Sr, and Ba) is a base material, and the base material is doped with light emitting ions such as a rare-earth ion and a transition metal ion is able to be included.

As the sulfide phosphor, thiosilicate expressed by a general formula: $M_2SiS_4$, thioaluminate expressed by a general formula: $MAl_2S_4$, and thiogallate (wherein, M is an alkaline earth element) expressed by a general formula: $MGa_2S_4$, or thioyittrate such as $Y_2O_2S$ as acid sulfide is included.

In addition, a phosphor in which the base material of the sulfide phosphor is doped with light emitting ions such as a rare-earth ion and a transition metal ion is included.

As the acid halide phosphor, a phosphor in which a base material such as halosilicate expressed by a general formula: $M_5SiO_4X_6$, $M_5Si_4O_{10}X_2$, $M_2LiSiO_4X$ (wherein, M is an alkaline-earth metal ion, and X is a halogen ion) is doped with light emitting ions such as rare-earth ions and transition metal ions is included.

As the phosphate phosphor, a phosphor in which a base material of a general formula: $MP_2O_6$, $M_5(PO_4)_3X_3$ (wherein, M is an alkaline-earth metal ion, and X is a halogen ion), $Na_3Sc_2(PO_4)_3$, or the like is doped with light emitting ions such as a rare-earth ion and a transition metal ion is included.

As the compound semiconductor phosphor, a nano-particle phosphor such as CdS, ZnSe, ZnTe, and CdSe is included.

Here, the alkaline-earth metal element is four elements of Ca, Sr, Ba, and Ra which are group II elements in a periodic table, and it is preferable that one or more selected from a group consisting of the four elements described above be included as a main component.

In addition, the rare-earth element is 15 element of La, Ce, Pr, Nd, Pm, Sm, Eu, Gd, Tb, Dy, Ho, Er, Tm, Yb, and Lu which is lanthanide series, and it is preferable that one or more selected from a group consisting of the above-described 15 elements be included as a main component.

The phosphors may be independently used, or may be used by mixing a plurality of various phosphors. In addition, the phosphor particles 21 generating fluorescence with a different wavelength may be used by mixing a plurality of types of phosphor particles.

Among the phosphor particles, a phosphor having a garnet structure, for example, an yttrium aluminum garnet (YAG:Ce) to which Ce is added, a terbium aluminum garnet (TAG:Ce) to which Ce is added, a calcium scandium silicate garnet ($Ca_3Sc_2Si_3O_{12}$:Ce) to which Ce is added, and the like are preferable.

The phosphor particles are able to be synthesized by a usual solid phase method, a sol-gel method, a coprecipitation method, a uniform precipitation method, a solvothermal method, a combustion method, a complex polymerization method, or the like.

The average particle diameter of the phosphor particles is preferably 500 nm or less, and is more preferably 20 nm or more and 300 nm or less.

Here, the reason that the average particle diameter of the phosphor particles is within the range described above is because the refractive index of the phosphor particles is within a range of 1.6 to 2.0, and thus when the average particle diameter of the phosphor particles exceeds 500 nm, Mei scattering occurs due to a refractive index difference between the matrix and the phosphor particles, as a result thereof, back scattering of the excitation light due to the phosphor particles increases, and luminance efficiency at the time of forming the resin composition by dispersing the phosphor particles in the resin decreases, and thus it is not preferable. Furthermore, when the average particle diameter of the phosphor particles is less than 20 nm, absorption efficiency of the light of the phosphor particles decreases, and thus it is not preferable.

As described above, a more preferable range of the average particle diameter of the phosphor particles is 20 nm or more and 300 nm or less.

As the inorganic particles 22, inorganic nano-particles which are transparent with respect to ultraviolet rays or visible light, and have a refractive index of 1.38 to 1.45 and a particle diameter of 200 nm or less are preferable, and for example, inorganic particles containing one or more selected from fine magnesium fluoride particles (a refractive index: 1.38), fine calcium fluoride particles (a refractive index: 1.43), fine strontium fluoride particles (a refractive index: 1.44), amorphous silica (a refractive index: 1.44), and the like are preferable, in particular, inorganic particles containing fine magnesium fluoride particles (a refractive index: 1.38) or fine calcium fluoride particles (a refractive index: 1.43) are preferable.

Here, the reason that the fine magnesium fluoride particles or the fine calcium fluoride particles are used as a material configuring the inorganic particles 22 is because the refractive index is low and the durability such as heat resistance and chemical resistance is excellent.

The fine magnesium fluoride particles or the fine calcium fluoride particles are able to be used together with strontium fluoride (a refractive index: 1.44) or amorphous silica (a refractive index: 1.45).

In the composite wavelength conversion particles 12, by containing the inorganic particles 22 containing the fine magnesium fluoride particles or the fine calcium fluoride particles, and the phosphor particles 21 having the refractive index of 1.6 or more, it is possible to limit the refractive index of the entire particles to be a desired refractive index of, for example, 1.6 or less.

The refractive index of the composite wavelength conversion particles 12 is able to be limited by changing a proportion of the fine magnesium fluoride particles or the fine calcium fluoride particles and the phosphor particles, that is, a proportion of mass of the fine magnesium fluoride particles or the fine calcium fluoride particles and mass of the phosphor particles.

Furthermore, the refractive index of the phosphor particles is also changed by the refractive index or an amount of the phosphor particles to be contained, and for example, when the refractive index of the inorganic particles 22 is 1.45 or less in order to set the refractive index of the entire particles to be 1.6 or less, more phosphor particles 21 are contained, and thus it is preferable.

The average particle diameter of the inorganic particles 22 is preferably 500 nm or less, and is more preferably 300 nm or less, or is less than or equal to a length of an excitation wavelength.

Here, when the average particle diameter exceeds 500 nm, Mei scattering occurs due to a refractive index difference between the inorganic particles 22, for example, the fine magnesium fluoride particles or the fine calcium fluoride particles and the phosphor particles 21, and utilization efficiency of the excitation light decreases, and thus it is not preferable.

The fine magnesium fluoride particles or the fine calcium fluoride particles are able to be prepared by using a known method. For example, by mixing an aqueous ammonium fluoride solution, an aqueous magnesium chloride solution, or an aqueous calcium chloride solution, the fine magnesium fluoride particles or the fine calcium fluoride particles are able to be created in a colloidal shape. Therefore, it is possible to simply prepare the fine magnesium fluoride particles or the fine calcium fluoride particles using a simple device.

The refractive index of the phosphor particles 21 in the composite wavelength conversion particles 12 is in a range of 1.6 to 1.9, on the other hand, the refractive index of the inorganic particles 22 is in a range of 1.38 to 1.45, and each particle diameter is shorter than the excitation wavelength, and thus the average refractive index of the composite wavelength conversion particles 12 is calculated by expression (1) using effective medium approximation.

$$N^2 = \phi_a N_a^2 + \phi_b N_b^2 \qquad \text{expression (1)}$$

Here, N: average refractive index of composite wavelength conversion particles
$\phi_a$: volume fraction of phosphor particles
$N_a$: refractive index of phosphor particles
$\phi_b$: volume fraction of transparent inorganic nano-particles
$N_b$: refractive index of transparent inorganic nano-particles The refractive index of the composite wavelength conversion particles 12 is able to be obtained based on the type of phosphor, the type of inorganic particles, and the weight ratio as shown by the expression (1) described above.

Here, as the refractive index of the composite wavelength conversion particles 12, the composite wavelength conversion particles 12 of which a refractive index difference between the composite wavelength conversion particles 12 and the transparent member 11 configuring the light transmitting member 4 is 0.1 or less are preferably used. Accordingly, it is possible to considerably limit the light loss according to light scattering in an interface between the composite wavelength conversion particles 12 and the transparent member 11 due to a refractive index difference between the composite wavelength conversion particles 12 and the transparent member 11.

When, for example, the fine magnesium fluoride particles or the fine calcium fluoride particles are used as the inorganic particles 22, the composite wavelength conversion particles 12 are able to be prepared as follows.

For example, the composite wavelength conversion particles 12 are able to be obtained by mixing the fine magnesium fluoride particles or the fine calcium fluoride particles having the average particle diameter of 500 nm or less and a precursor of the phosphor particles described above, by uniformly dispersing the precursor between the fine magnesium fluoride particles or the fine calcium fluoride particles, by performing a heat treatment with respect to the obtained mixture at a temperature range higher than or equal to a temperature at which the phosphor particles are created and crystallized, by creating the phosphor particles between the fine magnesium fluoride particles or the fine calcium fluoride particles, and by performing a heat treatment or a heat reduction treatment with respect to the phosphor particles at a temperature lower than a melting point of magnesium fluoride or calcium fluoride.

Furthermore, when the heat treatment temperature or the heat reduction treatment temperature is higher than or equal to the melting point of magnesium fluoride or calcium fluoride, the phosphor particles and the fine magnesium fluoride particles or the fine calcium fluoride particles are concurrently grown and are coarsed, and thus it is not preferable.

Figure 6:
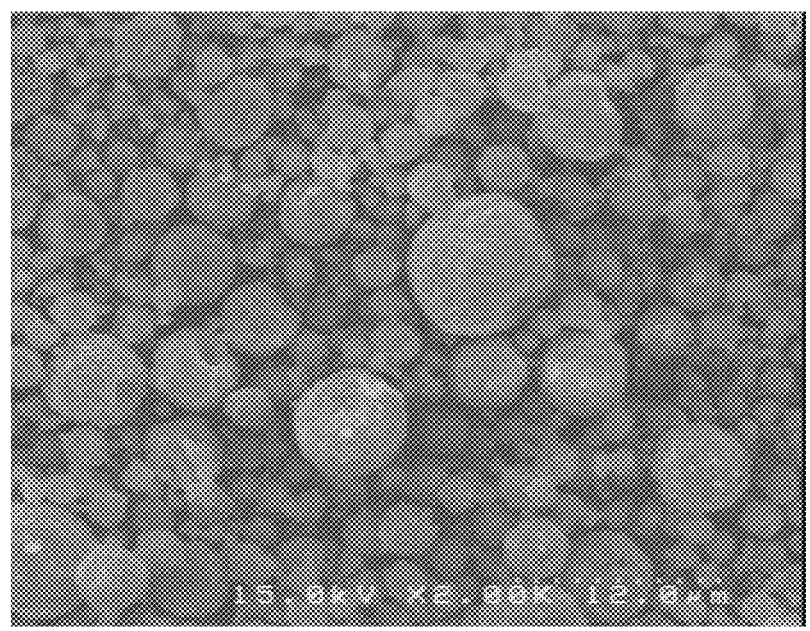
FIG. 6 is a scanning electron microscope image showing an example of the composite wavelength conversion particles of the second embodiment according to the present invention.
Figure 7:
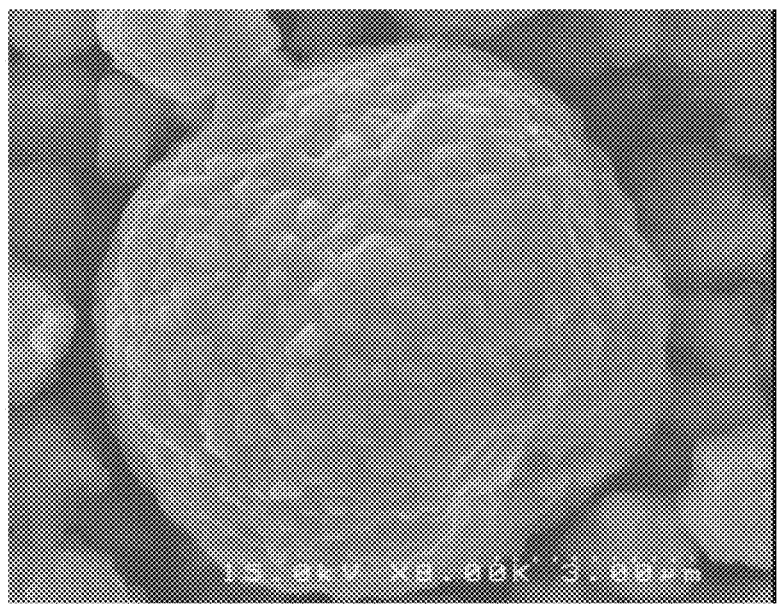
FIG. 7 is a scanning electron microscope image showing an example of the composite wavelength conversion particles of the second embodiment according to the present invention.

FIG. 6 is a scanning electron microscope (SEM) image showing an example of the composite wavelength conversion particles 12 of the embodiment, and FIG. 7 is a scanning electron microscope (SEM) image of the composite wavelength conversion particles scaled up four times.

Here, the composite wavelength conversion particles containing 60% by mass of the fine magnesium fluoride particles as the inorganic particles 22, 40% by mass of Ce added yttrium aluminum garnet (a composition of YAG:Ce is $Y_{2.76}Ce_{0.24}Al_5O_{12}$, and a concentration of Ce is 8 mol %) fine particles having a refractive index of 1.6 or more as the phosphor particles 21 were observed by using an SEM.

According to FIG. 6 and FIG. 7, it is understood that the fine magnesium fluoride particles and the Ce add yttrium aluminum garnet (YAG:Ce) fine particles were densely aggregated, and spherical aggregation was formed.

A dispersed distribution state of the composite wavelength conversion particles 12 in the light transmitting member 4 is not particularly limited, but it is preferable that a concentration of the composite wavelength conversion particles 12 in an upper portion of the light emitting element 3 or a region around the light emitting element 3 be high, and it is particularly preferable that the concentration of the composite wavelength conversion particles 12 in this region be 10% by mass or more and 60% by mass or less. This is because the excitation light emitted from the light emitting element 3 in various directions is efficiently absorbed in the phosphor particles 21 contained in the composite wavelength conversion particles 12. Furthermore, it is preferable that a particle diameter of the composite wavelength conversion particles 12 to be contained be 0.5 μm to 30 μm.

The light transmitting member 4 is able to be easily formed by using a method in which a coating material including the precursor of the transparent member 11 and the composite wavelength conversion particles 12 is filled to cover the light emitting element 3 using an injector such as a dispenser, and the coating material is irradiated with heat, ultraviolet rays, or the like, and is cured, and the like.

An inner circumferential surface 5a of the frame body 5 is a light reflection surface efficiently reflecting light of the light emitting element 3 and fluorescence from the phosphor particles 21 which is excited by the light of the light emitting element 3 and is emitted.

According to this configuration, the light reflection surface is formed to surround the light emitting element 3 and the composite wavelength conversion particles 12 containing the phosphor particles 21, and thus the light emitted from the phosphor particles 21 contained in the light emitting element 3 and the composite wavelength conversion particles 12 are efficiently reflected to an upper side of the light emitting device 1, that is, in a direction of an optical output surface 9, and absorption or transmission of the light by the base 6 described later is effectively limited. Therefore, it is possible to considerably improve discharge light intensity or luminance.

In order to limit a decrease in a reflection rate due to moisture, oxygen, hydrogen sulfide gas under an usage environment of the light emitting device 1, it is preferable that a front surface of the inner circumferential surface 5a which is the light reflection surface be attached with an inorganic material such as low melting point glass and sol-gel glass which have excellent transmissivity for a ultraviolet ray region to a infrared region, and an organic resin such as a silicone resin or an epoxy resin. As a result, it is possible to improve the corrosion resistance, the chemical resistance, and the weather resistance of the inner circumferential surface 5a which is the light reflection surface.

It is preferable that the inner circumferential surface 5a which is the light reflection surface be inclined to be tapered such that the inner circumferential surface 5a is widened toward the direction of the optical output surface 9. Accordingly, it is possible to efficiently reflect the light from the phosphor particles 21 contained in the light emitting element 3 and the composite wavelength conversion particles 12 to the upper side of the light emitting device 1, that is, in the direction of the optical output surface 9.

The average roughness (Ra) of the inner circumferential surface 5a which is the light reflection surface is preferably 0.2 μm to 5 μm.

Here, the reason that the average roughness (Ra) of the inner circumferential surface 5a is set to the range described above is because it is possible to reflect the light emitted from the light emitting element 3 with a high reflection rate and to emit the light toward the upper side of the light emitting device 1 in that range.

Here, when the average roughness (Ra) of the inner circumferential surface 5a exceeds 5 μm, the reflection rate of the light emitted from the light emitting element 3 on the inner circumferential surface 5a decreases, the reflected light is diffusely reflected from the inside of the light transmitting member 4, and thus it is not possible to emit the light having high luminance toward the direction of the light emitting device 1, and a light loss in the inside of the light emitting device 1 increases, it is not possible to output the light to the outside of the optical output surface 9 at a desired angle and with a high level of efficiency, and thus it is not preferable. In contrast, when the average roughness (Ra) of the inner circumferential surface 5a is below the 0.2 μm, the front surface of the inner circumferential surface 5a is flattened, and thus the reflection rate of the light emitted from the light emitting element 3 on the inner circumferential surface 5a increases, but it is difficult to efficiently and stably form the inner circumferential surface 5a by using a usual method, and the manufacturing costs may increase, and thus it is not preferable.

As a method of processing the inner circumferential surface 5a such that the average roughness (Ra) of the inner circumferential surface 5a is within the range described above, chemical polishing, electrolytic polishing, and the like are preferably used in addition to cutting and polishing.

Furthermore, a cross-sectional shape of the inner circumferential surface 5a may be a curved surface (an arc-like section) or the like in addition to a flat surface (a linear section) shown in FIG. 4. In particular, when the cross-sectional shape is the curved surface (the arc-like section), the light emitted from the light emitting element 3 is reflected by the inner circumferential surface 5a, and it is possible to emit the light toward the upper side of the light emitting device 1 with a small diameter and high luminance, and thus it is preferable.

The substrate 2 (hereinafter, referred to as a light emitting element attached substrate 2) on which the light emitting element 3 is mounted is mounted on an upper surface of the base 6, and the base 6 is an insulating body formed of an aluminum oxide sintered body, an aluminum nitride sintered body, a mullite sintered body, a ceramic such as glass, or an organic resin such as an epoxy resin, and functions as a supporting member supporting the light emitting element attached substrate 2.

The number of light emitting element attached substrates 2 mounted on an upper surface of the base 6 is not particularly limited. According to an intended purpose of the light emitting device 1, a plurality of light emitting element attached substrates 2 are able to be mounted.

When the base 6 is formed of a ceramic, the electric drive wiring 7 formed of metal such as tungsten (W), molybdenum (Mo), manganese (Mn), a molybdenum manganese alloy (Mo—Mn), and copper (Cu) is formed in order to be electrically connected to the inside of the light emitting device 1. Then, one electrode portion formed in the light emitting element 3 and one end of the electric drive wiring 7 are electrically connected to each other by a conductive member such as solder, and the other electrode portion formed on the light emitting element 3 and the other end of the electric drive wiring 7 are electrically connected to each other by a conductive member such as solder, and thus it is possible to electrically connect an external electric circuit substrate (not shown) and the light emitting element 3 to each other.

In addition, in order to inhibit the light emitted from an upper surface of the light emitting element 2 and fluorescence which is emitted from the phosphor by being excited by the light of the light emitting element from being transmitted to the base 8 and to efficiently reflect the light to an upper side of the base 8, as the base 6, it is preferable that a metallic reflective layer of aluminum (Al), silver (Ag), gold (Au), platinum (Pt), titanium (Ti), chromium (Cr), a silver alloy (Ag—Cu—Au, Ag—Nd—Cu, Ag—Zn—Pd, Au, and the like) be formed on an upper surface of the base 8 by a vapor-deposition method or a plating method such that the electric drive wiring 7 is not electrically short-circuited. In addition, for the same purpose, it is preferable that the metallic reflection surface 5 be formed on an inner circumferential surface of the frame body 6 which is attached by a metallic brazing material, solder, or a resin bonding material.

Furthermore, the electric drive wiring 7 is formed by using a known metallization method, a plating method, or the like, and a metallic layer such as an Ni layer having a thickness of 0.5 µm to 9 µm or an Au layer having a thickness of 0.5 µm to 5 µm with excellent corrosion resistance may be attached on the exposed front surface of the base 6. Accordingly, it is possible to effectively prevent the electric drive wiring 7 from being subjected to oxidation corrosion, and it is possible to make adhesion between the light emitting element 3 and the electrode (not shown) by a conductive member such as solder strong.

In the light emitting device 1 of the embodiment, the light output from the light emitting element 3 is incident on the light transmitting member 4. Here, the difference (the refractive index difference) between the refractive index of the composite wavelength conversion particles 12 formed of the phosphor particles 21 having the particle diameter of 500 nm or less, and the inorganic particles 22 having the refractive index of 1.38 to 1.45 and the particle diameter of 500 nm of less which are transparent with respect to ultraviolet rays or visible light, and the refractive index of the transparent member 11 configuring the light transmitting member 4 decreases, and thus the excitation light of the light emitting element 3, fluorescence due to the phosphor, and back side light scattering in the light transmitting member 4 decrease. Similarly, the phosphor particles 21 in a direction opposite to an output surface of the phosphor particles 21 limit light scattering in the interface between the composite wavelength conversion particles 12 and the transparent member 11. Therefore, the light is reflected on the inner circumferential surface 5a, and then is able to be efficiently taken out from the optical output surface 9.

As described above, according to the light emitting device 1 of the embodiment, the light emitting element 3 which is mounted on the upper surface of the substrate 2, and the light transmitting member 4 which covers and embeds the light emitting element 3 are included, and thus it is possible to reduce the amount of the light which is reflected and scattered on the interface of the composite wavelength conversion particles 12 in the light transmitting member 4 among the light emitted from the light emitting element 3, and it is possible to allow more primary irradiation light to be incident on the inner portion of the composite wavelength conversion particles 12. In addition, similarly, the secondary irradiation light emitted from the composite wavelength conversion particles 12 is also able to reduce the reflection and scattering due to the composite wavelength conversion particles 12 in the light transmitting member 4. Therefore, it is possible to improve utilization efficiency of the light due to the phosphor particles 21 excited by the primary irradiation light emitted by the light emitting element 3, and it is possible to improve the optical output of the light emission by increasing the amount of the secondary irradiation light generated from the phosphor particles 21.

In addition, by using a light source in which plurality of light emitting devices 1 of the embodiment, for example, are arranged into the shape of a grid, a zigzag, a radiation, a circular ring, a polygon, and the like as the light source, it is possible to make a surface light emitting illuminating device. In the illuminating device, it is possible to emit the light with stable emitted light intensity over a long period of time and at a emitted light angle (a light distribution). Accordingly, it is possible to provide an illuminating device having small color unevenness or a small deviation in the illuminance distribution in an irradiation surface.

Third Embodiment

Figure 8:
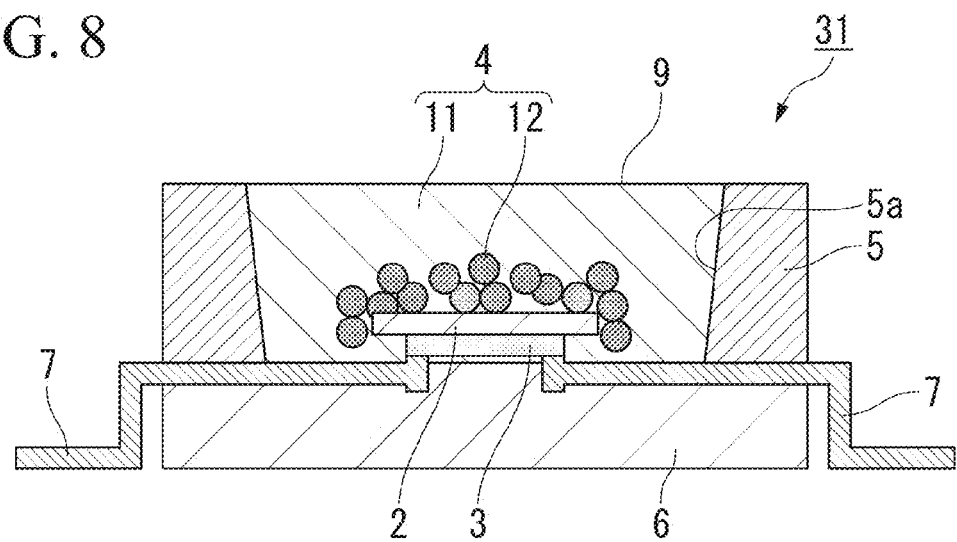
FIG. 8 is a cross-sectional view showing a flip chip type light emitting device of a third embodiment according to the present invention.

FIG. 8 is a cross-sectional view showing a flip chip type light emitting device of the second embodiment of the present invention, and a light emitting device 31 of the embodiment is different from the light emitting device 1 of the first embodiment in that the light emitting element 3 mounted on the front surface of the substrate 2 is covered with the light transmitting member 4 in the light emitting device 1 of the first embodiment, but in the light emitting device 31 of the embodiment, the light emitting element 3 is mounted on the front surface of the substrate 2, and a back surface (the other main surface) of the substrate 2 is covered with the light transmitting member 4, and further, the electrode (not shown) of the light emitting element 3 is directly and electrically connected to the electric drive wiring 7.

In the light emitting device 31 of the embodiment, the other configuration is completely identical to the light emitting device 1 of the second embodiment, and thus a description thereof will be omitted here.

In the light emitting device 31 of the embodiment, light output from the light emitting element 3 transmits the substrate 2 and is incident on the light transmitting member 4. Here, similar to the light emitting device 1 of the second embodiment, the difference (the refractive index difference) between the refractive index of the composite wavelength conversion particles 12, and the refractive index of the transparent member 11 configuring the light transmitting member 4 decreases, and thus the excitation light of the light emitting element 3, fluorescence due to the phosphor, and back side light scattering in the light transmitting member 4 decrease. Similarly, the phosphor particles 21 in the direction opposite to the output surface of the phosphor particles 21 limit light scattering in the interface between the composite wavelength conversion particles 12 and the transparent member 11. Therefore, the light is reflected on the inner circumferential surface 5a, and then is able to be efficiently taken out from the optical output surface 9.

In the light emitting device 31 of the embodiment, it is possible to obtain the same effect as that of the light emitting device 1 of the second embodiment.

INDUSTRIAL APPLICABILITY

In the composite wavelength conversion powder of the present invention, by dispersing the phosphor particles having the refractive index of 1.6 or more in the matrix particles containing the fine magnesium fluoride particles or the fine calcium fluoride particles, it is possible to increase utilization efficiency of the light and utilization efficiency of the constituent material, and it is possible to emit the light with a high level of efficiency, and the highly efficient light emission is stable over a long period of time, and thus it is possible to increase reliability, and by dispersing the composite wavelength conversion powder in the resin, it is possible to increase the utilization efficiency of the light and the utilization efficiency of the constituent material, and it is possible to make the highly efficient light emission and high reliability compatible, and thus the composite wavelength conversion powder is beneficial as a material of various optical devices such as various display devices, illuminating devices, solar power generation devices, photonic devices, and optical amplifiers, and has a large industrial value.

In addition, in the light emitting device of the present invention, the light emitting element mounted on one main surface of the substrate or the other main surface of the substrate is covered with the light transmitting member, and the light transmitting member contains the phosphor particles having an average particle diameter of 500 nm or less, and the composite wavelength conversion particles formed of the inorganic particles having the average particle diameter of 500 nm or less which are transparent with respect to the visible light, and thus it is possible to improve utilization efficiency of the light due to the phosphor particles excited by the primary irradiation light emitted by the light emitting element, it is possible to improve the optical output of the light emission by increasing the amount of secondary irradiation light generated from the phosphor particles, and thus it is possible to apply the light emitting device to a light emitting device having a structure different from that of the light emitting device in addition to the face up type light emitting device or the flip chip type light emitting device, and the light emitting device has a large industrial value.

REFERENCE SIGNS LIST 1 light emitting device
2 substrate
3 light emitting element
4 light transmitting member
11 transparent member
12 composite wavelength conversion particles
21 phosphor particles
22 inorganic particles
31 light emitting device

The invention claimed is:

1. A composite wavelength conversion powder comprising matrix particles containing fine magnesium fluoride particles or fine calcium fluoride particles, and phosphor particles having a refractive index of 1.6 or more dispersed in the matrix particles,
wherein an amount of the phosphor particles with respect to total mass of the matrix particles is 20% by mass to 70% by mass.

2. The composite wavelength conversion powder according to claim 1, wherein the phosphor particles consist of a phosphor which is excited by ultraviolet rays or visible light and emits visible light or infrared rays.

3. The composite wavelength conversion powder according to claim 1, wherein the phosphor particles consist of a phosphor having a garnet structure.

4. A resin composition containing a composite wavelength conversion powder comprising the composite wavelength conversion powder according to any one of claims 1 to 3 dispersed in a resin.

5. A light emitting device, comprising a substrate, a light emitting element which is mounted on one main surface of the substrate, and a light transmitting member which covers one of the light emitting element and the other main surface of the substrate,
wherein the light transmitting member contains composite wavelength conversion particles consisting of phosphor particles having an average particle diameter of 500 nm or less, and inorganic particles having an average particle diameter of 500 nm or less which are transparent with respect to ultraviolet rays and visible light.

6. The light emitting device according to claim 5, wherein the light transmitting member is a resin composition containing composite wavelength conversion particles consisting of the composite wavelength conversion particles contained in a resin.

7. The light emitting device according to claim 6, wherein an average particle diameter of the composite wavelength conversion particles or the resin composition containing the composite wavelength conversion particles is 0.5 μm or more and 30 μm or less.

8. The light emitting device according to claim 6, wherein a refractive index of the inorganic particles is 1.38 to 1.45.

9. The light emitting device according to claim 6, wherein the inorganic particles contain one or more selected from a group consisting of magnesium fluoride, calcium fluoride, and strontium fluoride.

10. The light emitting device according to claim 6, wherein the phosphor particles consist of a phosphor having a garnet structure.

11. The light emitting device according to any one of claims 6 to 10, wherein the light transmitting member contains a silicone resin having a refractive index of 1.42 to 1.55.

12. The composite wavelength conversion powder according to claim 1, wherein the phosphor particles have an average particle diameter of 500 nm or less, and fine magnesium fluoride particles or fine calcium fluoride particles have an average particle diameter of 500 nm or less.

* * * * *